United States Patent
Kuehnel et al.

(10) Patent No.: US 11,719,539 B2
(45) Date of Patent: Aug. 8, 2023

(54) MICROMECHANICAL COMPONENT FOR A YAW RATE SENSOR AND CORRESPONDING PRODUCTION METHOD

(71) Applicant: Robert Bosch GmbH, Stuttgart (DE)

(72) Inventors: Matthias Kuehnel, Boeblingen (DE); Nils Felix Kuhlmann, Ehningen (DE); Robert Maul, Reutlingen (DE); Rolf Scheben, Reutlingen (DE); Steffen Markisch, Reutlingen (DE); Thorsten Balslink, Kirchentellinsfurt (DE); Wolfram Geiger, Gomaringen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 64 days.

(21) Appl. No.: 17/235,363

(22) Filed: Apr. 20, 2021

(65) Prior Publication Data

US 2021/0333103 A1    Oct. 28, 2021

(30) Foreign Application Priority Data

Apr. 28, 2020   (DE) .......................... 102020205372.3

(51) Int. Cl.
*G01P 3/44*      (2006.01)
*G01C 19/5712*   (2012.01)
*G01C 25/00*     (2006.01)
*B81B 3/00*      (2006.01)

(52) U.S. Cl.
CPC ........ *G01C 19/5712* (2013.01); *B81B 3/0021* (2013.01); *G01C 25/00* (2013.01); *G01P 3/44* (2013.01); *B81B 2201/0242* (2013.01)

(58) Field of Classification Search
CPC .......................... G01C 19/5712; G01C 25/00; G01C 19/5755; G01C 19/5769; B81B 3/0021; B81B 2201/0242; B81B 3/0062; B81B 7/02; B81B 2201/02; G01P 3/44; B81C 3/00
See application file for complete search history.

(56) References Cited

U.S. PATENT DOCUMENTS 9,506,756 B2 * 11/2016 McNeil ............. G01C 19/5712
2002/0149294 A1 * 10/2002 Matsumoto ........... H02N 1/006
310/309

(Continued)

FOREIGN PATENT DOCUMENTS

DE      102017216010 A1    3/2019

*Primary Examiner* — David J Bolduc
(74) *Attorney, Agent, or Firm* — Norton Rose Fulbright US LLP; Gerard Messina (57) ABSTRACT

A micromechanical component for a yaw rate sensor. The component includes a substrate having a substrate surface, a first rotor mass developed in one piece, which is able to be set into a first torsional vibration about a first axis of rotation aligned perpendicular to the substrate surface, and at least one first component of the micromechanical component. The first rotor mass is connected to the at least one first component via at least one first spring element. The at least one first spring element extends through a lateral concavity on the first rotor mass in each case and is connected to a recessed edge region of the first rotor mass. A yaw rate sensor and a production method for a micromechanical component for a yaw rate sensor, are also described.

7 Claims, 3 Drawing Sheets

(56) References Cited

U.S. PATENT DOCUMENTS

| | | | |
|---|---|---|---|
| 2003/0164041 A1* | 9/2003 | Jeong | G01C 19/5712 73/504.08 |
| 2005/0081633 A1* | 4/2005 | Nasiri | G01C 19/5712 73/514.29 |
| 2006/0219006 A1* | 10/2006 | Nasiri | G01C 19/56 73/504.12 |
| 2008/0115579 A1* | 5/2008 | Seeger | G01C 19/5712 73/504.12 |
| 2011/0023600 A1* | 2/2011 | Wrede | G01C 19/5712 73/504.13 |
| 2011/0056295 A1* | 3/2011 | Classen | G01P 15/0802 73/514.32 |
| 2011/0296913 A1* | 12/2011 | Ohms | G01C 19/5755 73/504.12 |
| 2012/0048018 A1* | 3/2012 | Hammer | G01P 15/08 73/504.12 |
| 2013/0298672 A1* | 11/2013 | Kuhlmann | G01C 19/56 73/504.12 |
| 2013/0340522 A1* | 12/2013 | Kuhlmann | G01C 19/56 73/504.12 |
| 2014/0260610 A1* | 9/2014 | McNeil | G01C 19/5712 73/504.12 |
| 2014/0373628 A1* | 12/2014 | Balslink | G01C 19/5712 73/504.12 |
| 2015/0068308 A1* | 3/2015 | Blomqvist | B81B 7/0058 73/504.12 |
| 2016/0084653 A1* | 3/2016 | Balslink | G01C 19/5712 73/504.12 |
| 2016/0334215 A1* | 11/2016 | Kato | G01C 19/5719 |
| 2018/0231381 A1* | 8/2018 | Lassi | G01C 19/5747 |
| 2019/0078887 A1* | 3/2019 | Bode | G01C 19/5747 |
| 2019/0154446 A1* | 5/2019 | Komizo | G01C 19/5769 |
| 2019/0383612 A1* | 12/2019 | Geisberger | G01C 19/5747 |
| 2020/0124418 A1* | 4/2020 | Blomqvist | G01P 15/02 |
| 2020/0355500 A1* | 11/2020 | Pruetz | G01C 19/5712 |

* cited by examiner

MICROMECHANICAL COMPONENT FOR A YAW RATE SENSOR AND CORRESPONDING PRODUCTION METHOD

CROSS REFERENCE

The present application claims the benefit under 35 U.S.C. § 119 of German Patent Application No. DE 102020205372.3 filed on Apr. 28, 2020, which is expressly incorporated herein by reference in its entirety.

FIELD

The present invention relates to a micromechanical component for a yaw rate sensor and to a yaw rate sensor. The present invention also relates to a production method for a micromechanical component for a yaw rate sensor.

BACKGROUND INFORMATION

In German Patent Application No. DE 10 2017 216 010 A1, a micromechanical yaw rate sensor system is described, which has two rotor masses that can be set into torsional vibrations with the aid of a drive frame device. For this purpose, the two rotor masses are connected to the drive frame device with the aid of webs. In addition, four seismic masses can be set into harmonic co-vibrations by the drive frame device.

SUMMARY

The present invention provides a micromechanical component for a yaw rate sensor, a yaw rate sensor, and a production method for a micromechanical component for a yaw rate sensor.

The present invention provides micromechanical components, which may advantageously be used at least as part of a yaw rate sensor, in particular a 3-axis yaw rate sensor. Because the at least one rotor mass of a micromechanical component according to an example embodiment of the present invention is connected to the at least one first/second component via an "elongated spring structure", a mechanical advantage for a force transmission to the respective rotor mass is realized in which the point of application of the respective lever lies closer to the intersection of the respective rotor mass with its axis of rotation. This improves a force and/or torque transmission to the respective rotor mass.

The improved force and/or torque transmission to the respective rotor mass may also be used for a miniaturization of the at least one rotor mass of a micromechanical component according to the present invention and of the respective micromechanical component. The micromechanical component according to an example embodiment of the present invention therefore requires only relatively little space, which is why the yaw rate sensors realized with the micromechanical component are able to be used in a much more varied manner.

In one advantageous embodiment of the present invention, the micromechanical component additionally has a second rotor mass realized in one piece, which is in mirror symmetry with the first rotor mass in relation to a plane of symmetry that is aligned perpendicular to the substrate surface and centrally intersects the first rotor mass and the second rotor mass, and that is able to be set into a second torsional vibration, phase-shifted by 180° in relation to the first torsional vibration, about a second axis of rotation aligned in parallel with the first axis of rotation, the second rotor mass being connected to the at least one first component and/or to at least one second component of the micromechanical component via at least one second spring element, and the at least one second spring element extends through a lateral concavity on the second rotor mass in each case and is connected to a recessed edge region of the second rotor mass. The micromechanical component may thus be realized with a dual rotor whose advantages are enumerated further below.

In a further advantageous embodiment of the micromechanical component, the two rotor masses are developed and/or positioned in such a way that the two rotor masses, set into their respective torsional vibration, are pivotable about an axis of rotation situated in the first plane of symmetry and pivotable about a further axis of rotation aligned perpendicular to the first plane of symmetry in each case. The two rotor masses may thus be used both for detecting a first rotary motion of the respective micromechanical component about a first axis, which lies in the first plane of symmetry and is aligned in parallel with the substrate surface, and for detecting a second rotary motion of the respective micromechanical component about a second axis, which lies in the second plane of symmetry and is aligned in parallel with the substrate surface.

The micromechanical component as the at least one first component may particularly include at least one rocker structure, which is aligned in parallel with the plane of symmetry and to which the first rotor mass is connected via the at least one first spring element and to which the second rotor mass is connected via the at least one second spring element. As is described in greater detail below, undesired movements of the two rotor masses are able to be selectively suppressed with the aid of the at least one rocker structure. The at least one rocker structure thus advantageously counteracts an occurrence of undesired interference modes.

In a further advantageous embodiment of the present invention, the micromechanical component as the at least one first component has a first pair of drive structures and as the at least one second component has a second pair of drive structures, the first drive structures of the first pair and of the second pair, situated on a first side of the plane of symmetry, are in mirror symmetry with the second drive structures of the first pair and of the second pair situated on a second side of the plane of symmetry in relation to the plane of symmetry, and the first drive structure of the first pair is able to be set into a first harmonic torsional vibration aligned in parallel with the plane of symmetry; the second drive structure of the first pair is able to be set into a second harmonic torsional vibration, which is aligned in parallel with the plane of symmetry and phase-shifted by 180° in relation to the first harmonic torsional vibration; the first drive structure of the second pair is able to be set into the second harmonic torsional vibration, and the second drive structure of the second pair is able to be set into the first harmonic torsional vibration such that the two rotor masses are set into their respective torsional vibration with the aid of the four drive structures set into their respective vibration. In this case, an amplitude of the torsional vibrations of the two rotor masses is increased on account of the "elongated spring structure".

In a preferred manner, in accordance with an example embodiment of the present invention, the two rotor masses are developed and/or situated in such a way that when the two rotor masses are set into their respective torsional vibration, a vector sum of a first torque of the first torsional vibration of the first rotor mass and of a second torque of the second torsional vibration of the second rotor mass is equal to zero. In this way, an undesired coupling of one of the torques of the two rotor masses into the sensor design of the respective micromechanical component is prevented even if the two rotor masses are set into their respective torsional vibration.

In a preferred manner, in accordance with an example embodiment of the present invention, the micromechanical component additionally has a first pair of seismic masses and a second pair of seismic masses, the first seismic masses of the first pair and the second pair, situated on a first side of the plane of symmetry, being in mirror symmetry in relation to the plane of symmetry with the second seismic masses of the first pair and the second pair situated on a second side of the plane of symmetry, and the four seismic masses are able to be set into harmonic torsional co-vibrations, which are aligned in parallel with the plane of symmetry, with the aid of the two rotor masses set into their respective torsional vibration and/or with the aid of the four drive structures set into their respective harmonic torsional vibrations. A vector sum of the pulses of the harmonic torsional co-vibrations of the four seismic masses is therefore zero so that no undesired coupling of one of the pulses of the seismic masses into the sensor design of the respective micromechanical component has to be expected.

The four seismic masses, set into their respective harmonic torsional co-vibrations, are preferably also deflectable in parallel with the second plane of symmetry. As described in greater detail below, in this case the four seismic masses are able to be used for detecting an (additional) third rotary motion of the respective micromechanical component about a third axis aligned perpendicular to the substrate surface.

The above-described advantages are also ensured in a yaw rate sensor equipped with such a micromechanical component. It is expressly pointed out that the yaw rate sensor may in particular be a 3-axis yaw rate sensor. A 3-axis yaw rate sensor in this case should be understood to denote that a first rotary motion of the yaw rate sensor about a first axis situated in the first plane of symmetry and aligned in parallel with the substrate surface is detectable with the aid of the respective yaw rate sensor and also using the two rotor masses, and likewise a second rotary motion of the yaw rate sensor about a second axis is detectable, which is situated in the second plane of symmetry and aligned in parallel with the substrate surface, using the two rotor masses, and a third rotary motion of the yaw rate sensor about a third axis aligned perpendicular to the substrate surface is detectable with the aid of the four seismic masses. A detection of the respective rotary motion in this case may be both a detection of the respective rotary motion and a measurement of a physical variable that represents the respective rotary motion such as a rate of rotation, a rotational speed, and/or an angular speed, for instance.

In addition, the execution of a corresponding production method for a micromechanical component for a yaw rate sensor also provides the afore-described advantages, and the production method according to the above-described embodiments of the micromechanical component is able to be further refined.

BRIEF DESCRIPTION OF THE DRAWINGS

Additional features and advantages of the present invention are described below with the aid of the figures.

DETAILED DESCRIPTION OF EXAMPLE EMBODIMENTS

Figure 1:
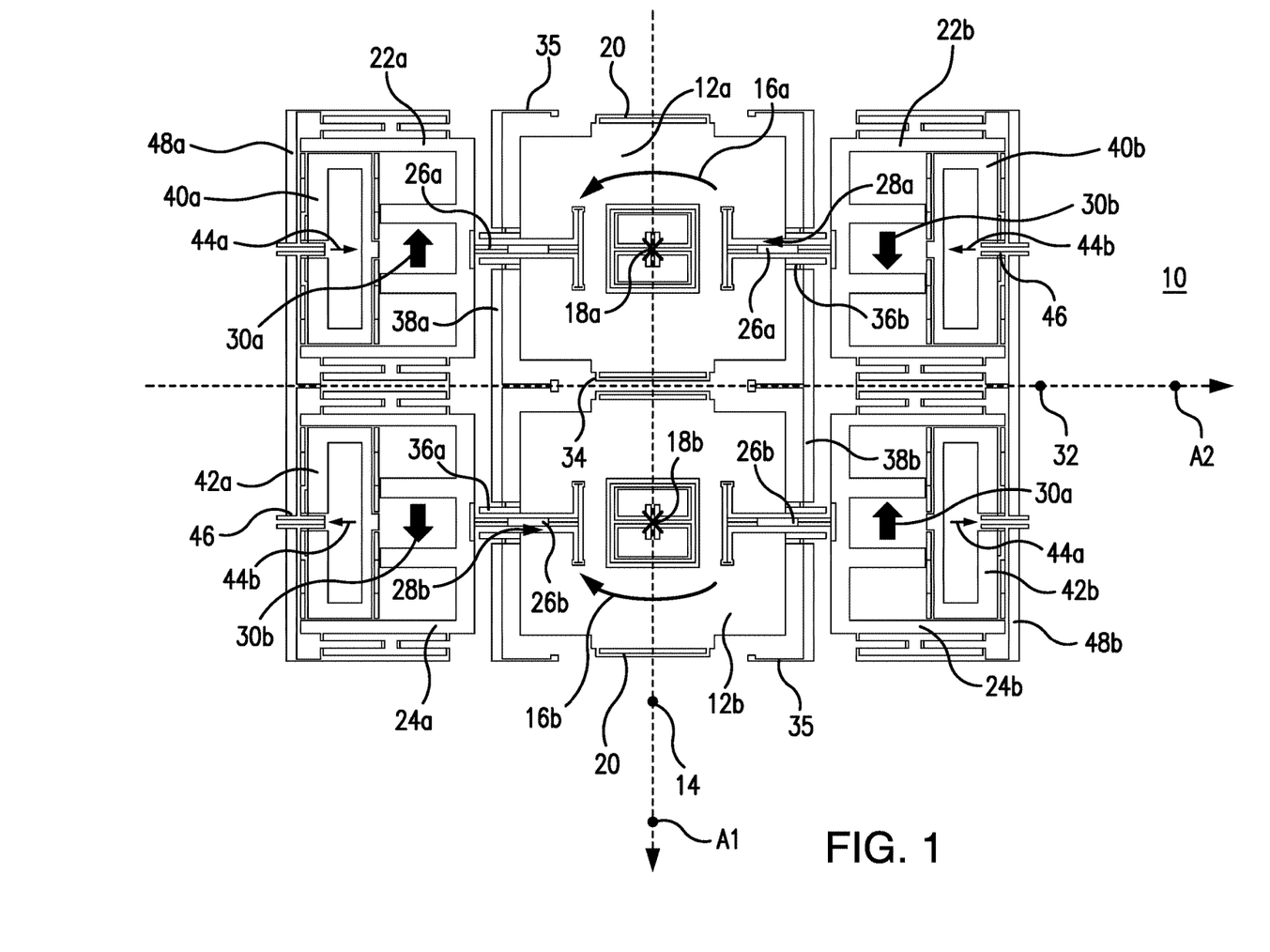
FIG. 1 shows a schematic representation of a first embodiment of the micromechanical component, in accordance with the present invention.

FIG. 1 shows a schematic representation of a first example embodiment of the micromechanical component.

The micromechanical component schematically illustrated in FIG. 1 has a substrate having a substrate surface 10. For instance, the substrate may be a semiconductor substrate, in particular a silicon substrate.

In addition, the micromechanical component has at least one first rotor mass 12a developed in one piece. Optionally, the micromechanical component may additionally also have a second rotor mass 12b developed in one piece, second rotor mass 12b being developed in mirror symmetry with first rotor mass 12a, preferably in relation to a first plane of symmetry 14 which is aligned perpendicular to substrate surface 10 and centrally intersects first rotor mass 12a and second rotor mass 12b. A development of first/second rotor mass 12a or 12b in one piece is to be understood such that respective first/second rotor mass 12a or 12b is realized as an uninterrupted, intrinsically compact part. At least first rotor mass 12a is able to be set into a first torsional vibration 16a about a first axis of rotation 18a aligned perpendicular to substrate surface 10. In an advantageous manner, second rotor mass 12b in the micromechanical component of FIG. 1 is able to be set into a second torsional vibration 16b about a second axis of rotation 18b aligned in parallel with first axis of rotation 18a, second torsional vibration 16b being phase-shifted by 180° relative to first torsional vibration 16a.

Merely by way of example, in the embodiment of the micromechanical component described here, each of the two rotor masses 12a and 12b has an inner recess through which axis of rotation 18a or 18b of respective rotor mass 12a or 12b extends, the respective inner recess being restricted by an inner side edge of respective rotor mass 12a or 12b. In addition, each of the two rotor masses 12a and 12b is exemplarily connected to/in the micromechanical component via at least one rotor-mass connection spring (not sketched), which extends from the inner side edge of respective rotor mass 12a or 12b to an anchoring region fixed in place on substrate surface 10. In addition, each of the two rotor masses 12a and 12b is also connected to/in the micromechanical component via a rotor-mass connection spring 20 in each case, which extends from an outer side edge of respective rotor mass 12a or 12b to an anchoring region fixed in place on substrate surface 10.

The micromechanical component also includes at least one first component 22a and 22b, to which first rotor mass 12a is connected via the at least one first spring element 26a, the at least one first spring element 26a extending through a lateral concavity 28a (on the outer side edge) of first rotor mass 12a and being connected to a recessed edge region of first rotor mass 12a. In an advantageous manner, second rotor mass 12b is additionally able to be connected via at least one second spring element 26b to the at least one first component 22a and 22b and/or to the at least one second component 24a and 24b of the micromechanical component, the at least one second spring element 26b in this case extending through a lateral concavity 28b on second rotor mass 12b in each case and being connected to a recessed edge region of second rotor mass 12b.

At least first rotor mass 12a is thus connected to the at least one first component 22a and 22b via an "elongated spring structure". As an advantageous further refinement, second rotor mass 12b may also be connected to the at least one first component 22a and 22b and/or to the at least one second component 24a and 24b via an "elongated spring structure". The "elongated spring structure" in any case realizes a mechanical advantage for a force transmission to respective rotor mass 12a or 12b. Since the point of engagement of the respective lever lies closer to the intersection of respective rotor mass 12a or 12b and its axis of rotation 18a or 18b due to the development of respective lateral concavity 28a or 28b and the connection of respective spring element 26a or 26b to the recessed edge region, the force and/or torque transmission to respective rotor mass 12a or 12b is/are improved. Examples of the use of this force and/or torque transmission to respective rotor mass 12a or 12b are described below.

Lateral concavity 28a or 28b may also be described as an indentation developed on the side of respective rotor mass 12a or 12b or as a depression of respective rotor mass 12a or 12b developed on the side of respective rotor mass 12a or 12b. The recessed edge region, which is developed on respective rotor mass 12a or 12b by its lateral concavity 28a or 28b, is to be understood as a region of respective rotor mass 12a or 12b whose distance to the intersection of respective rotor mass 12a or 12b with its axis of rotation 18a or 18b is smaller than a minimum distance of the outer edge region, situated at an outer boundary of lateral concavity 28a or 28b, of the same rotor mass 12a or 12b to this intersection.

In the embodiment of FIG. 1, the micromechanical component as the at least one first component 22a and 22b has a first pair of drive structures 22a and 22b and as the at least one second component 24a and 24b it has a second pair of drive structures 24a and 24b. A first drive structure 22a of the first pair and a second drive structure 22b of the first pair are connected to first rotor mass 12a via a first spring element 26a. Accordingly, a first drive structure 24a of the second pair and a second drive structure 24b of the second pair are connected to second rotor mass 12b via a second spring element 26b in each case. With regard to first plane of symmetry 14, first drive structures 22a and 24a of the first pair and the second pair, situated on a first side of first plane of symmetry 14, are in mirror symmetry with second drive structures 22b and 24b of the first pair and the second pair situated on a second side of first plane of symmetry 14.

The four drive structures 22a, 22b, 24a and 24b are developed/situated in such a way in each case that first drive structure 22a of the first pair is able to be set into a first harmonic torsional vibration 30a aligned in parallel with first plane of symmetry 14; second drive structure 22b of the first pair is able to be set into a second harmonic torsional vibration 30b, which is aligned in parallel with first plane of symmetry 14 and phase-shifted by 180° in relation to first harmonic torsional vibration 30a; first drive structure 24a of the second pair is able to be set into the second harmonic torsional vibration 30b, and second drive structures 24b of the second pair are able to be set into the first harmonic torsional vibration 30a. The four drive structures 22a, 22b, 24a and 24b are preferably developed with drive-electrode elements (not shown), which form a capacitor with a (not depicted) stationary drive electrode, which is fixed in place on substrate surface 10, for instance. Each of the four drive structures 22a, 22b, 24a and 24b may be a drive frame, for example.

The four drive structures 22a, 22b, 24a and 24b are able to be set into their respective harmonic vibration 30a or 30b in such a way that with the aid of the four drive structures 22a, 22b, 24a and 24b set into their respective harmonic vibration 30a or 30b, the two rotor masses 12a and 12b are set into their respective torsional vibration 16a or 16b. Harmonic torsional vibrations 30a and 30b of the four drive structures 22a, 22b, 24a and 24b thus induce respective torsional vibration 16a or 16b of the two rotor masses 12a and 12b. Because of the mechanical advantage realized with the aid of the "elongated spring structure", the drive amplitude of harmonic vibrations 30a or 30b is transmitted closer to the intersection of respective rotor mass 12a or 12b with its axis of rotation 18a or 18b. During the torsional vibrations 16a and 16b of the two rotor masses 12a and 12b, the (maximum) amplitude of the outer side edges of rotor masses 12a and 12b is therefore greater than the drive amplitude of harmonic vibrations 30a or 30b. The "elongated spring structure" thus causes a rise in the amplitude of torsional vibrations 16a and 16b of rotor masses 12a and 12b.

In addition, each one of the two rotor masses 12a and 12b, set into its respective torsional vibration 16a or 16b, is pivotable about a first axis of rotation (not illustrated), which is situated in first plane of symmetry 14 (and preferably aligned in parallel to substrate surface 10) and about a second axis of rotation (not shown), which is aligned perpendicular to first plane of symmetry 14 (and preferably in parallel with substrate surface 10). The micromechanical component of FIG. 1 is therefore advantageously suitable as/for a yaw rate sensor. In addition, with respect to a second plane of symmetry 32 aligned perpendicular to substrate surface 10 and perpendicular to first plane of symmetry 14, first rotor mass 12a and the first pair of drive structures 22a and 22b may be in mirror symmetry with second rotor mass 12b and the second pair of drive structures 24a and 24b.

In a first rotary motion of the micromechanical component about a first axis A1, which is situated in first plane of symmetry 14 and aligned in parallel with substrate surface 10, the Coriolis force causes first pivot movements of the two rotor masses 12a and 12b, set into their first torsional vibration 16a or 16b, about their respective first axis of rotation, the first pivot motions of the two rotor masses 12a and 12b being in mirror symmetry in relation to second plane of symmetry 32 on account of the phase angle of 180° between first torsional vibration 16a and second torsional vibration 16b. Such motions of the two rotor masses 12a and 12b in mirror symmetry in relation to second plane of symmetry 32 are not triggered by external linear and rotational accelerations.

Because of the rise in amplitude of torsional vibrations 16a and 16b of rotor masses 12a and 12b realized by the "elongated spring structure", the first pivot movements are furthermore easily detectable. Each one of the two rotor masses 12a and 12b, for example, may be allocated a first pair of sensor electrodes (not sketched), which extends along first plane of symmetry 14 adjacent to allocated rotor mass 12a or 12b, each one of the sensor electrodes of the first pair forming a capacitor with allocated rotor mass 12a or 12b. The first pairs of sensor electrodes may be fixed in place on substrate surface 10, for instance. In a differential evaluation of the signals ascertained with the aid of the first pairs of sensor electrodes, the mirror symmetry of the first pivot movements of the two rotor masses 12a and 12b in relation to second plane of symmetry 32 induces an amplification of the signals triggered by the first rotary motion of the micromechanical component about first axis A1, while error signals of the first pairs of sensor electrodes attributable to external linear and rotational accelerations of the micromechanical components are automatically corrected/"filtered out" with the aid of the differential evaluation. The first rotary motion of the micromechanical component about first axis A1 is therefore reliably detectable with the aid of the two rotor masses 12a and 12b.

Accordingly, in a second rotary motion of the micromechanical component about a second axis A2 situated within second plane of symmetry 32 and aligned in parallel with substrate surface 10, the Coriolis force causes second pivot movements of rotor masses 12a and 12b set into their respective torsional vibration 16a or 16b, the second pivot movements of the two rotor masses 12a and 12b being point-symmetrical with respect to a line of intersection of first plane of symmetry 14 with second plane of symmetry 32 on account of the phase angle of 180° between first torsional vibration 16a and second torsional vibration 16b. Such point-symmetrical movements of the two rotor masses 12a and 12b with respect to the line of intersection are not triggered by external linear and rotational accelerations.

In this case as well, the second pivot movements are easily detectable on account of the rise in the amplitude of torsional vibrations 16a and 16b of rotor masses 12a and 12b realized with the aid of the "elongated spring structure". Each one of the two rotor masses 12a and 12b, for example, may also be allocated a second pair of sensor electrodes (not shown), which extends along a line that is aligned in parallel with second plane of symmetry 32 adjacent to allocated rotor mass 12a or 12b, each one of the sensor electrodes of the second pairs forming a capacitor with allocated rotor mass 12a or 12b. The second pairs of sensor electrodes may likewise be fixed in place on substrate surface 10, in particular. In a differential evaluation of the signals ascertained with the aid of the second pairs of sensor electrodes, the point symmetry of the second pivot movements of the two rotor masses 12a and 12b causes an amplification of the signals attributable to the second rotary motion of the micromechanical component about second axis A2, while error signals of the second pairs of sensor electrodes based on external linear and rotational accelerations of the micromechanical component are automatically corrected/"filtered out" with the aid of the differential evaluation. The second rotary motion of the micromechanical component about second axis A2 is therefore also reliably detectable with the aid of the two rotor masses 12a and 12b.

The two rotor masses 12a and 12b can thus be referred to as a dual rotor, which may advantageously be used for carrying out vibration-robust measurements for first axis A1 and second axis A2. The increase in the amplitude of torsional vibrations 16a and 16b of rotor masses 12a and 12b realized by the "elongated spring structure" advantageously contributes to the increase in the sensitivity of the dual rotor even given its relatively small development. In addition, in the described embodiment of the two rotor masses 12a and 12b, it is also ensured that even when the two rotor masses 12a and 12b are set into their respective torsional vibrations 16a or 16b, a vector sum of a first torque of first torsional vibration 16a of first rotor mass 12a and a second torque of second torsional vibration 16b of second rotor mass 12b is (essentially always) equal to zero. An undesired coupling of one of the torques of one of the two rotor masses 12a and 12b thus does not have to be expected even when the two rotor masses 12a and 12b are set into their respective torsional vibration 16a or 16b.

As an advantageous further refinement, the two rotor masses 12a and 12b are additionally coupled with each other via an (optional) intermediate spring 34, which does not counteract the first pivot movements of the two rotor masses 12a and 12b about first axis A1 that are triggered by the first rotary motion of the micromechanical component and are in mirror symmetry with second plane of symmetry 32, but which suppresses asymmetrical movements of the two rotor masses 12a and 12b in relation to second plane of symmetry 32 about their first axis of rotation, which are usually triggered by linear and rotational accelerations of the micromechanical component. In the example of FIG. 1, intermediate spring 34 has a first end region which includes a fork connected to first rotor mass 12a, a second end region having a fork connected to second rotor mass 12b, and a web-shaped intermediate section situated between the two end regions. However, the form of intermediate spring 34 shown in FIG. 1 should be considered only as an example. Alternatively, intermediate spring 34 may also be an O-spring, for instance, which has a web-shaped first end section (connected to first rotor mass 12a), a web-shaped second end region (connected to second rotor mass 12b), and an intermediate section situated between the two end regions, four web-shaped spring sections in O-shape or in a rectangular shape making up the intermediate section.

As an additional (optional) further refinement, each one of the two rotor masses 12a and 12b is also connected via a first spring 36a to a first rocker structure 38a aligned in parallel with first plane of symmetry 14, and connected via a second spring 36b to a second rocker structure 38b aligned in parallel with first plane of symmetry 14. Each rocker structure 38a and 38b is pivotable about a rocker axis situated in second plane of symmetry 32 (and preferably aligned in parallel with substrate surface 10). Each rocker structure 38a and 38b may be connected on/in the micromechanical component, for instance via at least one rocker structure connection spring 35, which may extend from the respective rocker structure 38a or 38b to an anchoring region fixed in place on substrate surface 10. Rocker structures 38a and 38b do not counteract the point-symmetrical second pivot movements of the two rotor masses 12a and 12b, while mirror-symmetrical movements of the two rotor masses 12a and 12b about their respective second axis of rotation in relation to second plane of symmetry 32 are suppressed by the two rocker structures 38a and 38b.

In addition, the micromechanical component of FIG. 1 includes a first pair of seismic masses 40a and 40b and a second pair of seismic masses 42a and 42b, which are in mirror symmetry in relation to first plane of symmetry 14. With the aid of the two rotor masses 12a and 12b set into their respective torsional vibration 16a or 16b, and/or with the aid of the four drive structures 22a, 22b, 24a and 24b set into their respective harmonic co-vibration, the four seismic masses 40a, 40b, 42a and 42b are able to be set into harmonic co-vibrations which are aligned in parallel with first plane of symmetry 14. In an advantageous manner, a first seismic mass 40a of the first pair is able to be set/is set into a first harmonic co-vibration aligned in parallel with first plane of symmetry 14; a second seismic mass 40b of the first pair, which is in mirror symmetry with first seismic mass 40a of the first pair in relation to first plane of symmetry 14, is able to be/is set into a second harmonic co-vibration aligned in parallel with first plane of symmetry 14; a first seismic mass 42a of the second pair is able to be set/is set into the second harmonic co-vibration; and a second seismic mass 42b of the second pair, which is in mirror symmetry in relation to the first plane of symmetry with first mass 42a of the second pair, is able to be set/is set into the second harmonic co-vibration. An essential advantage of the described excitation of the harmonic co-vibrations of the four seismic masses 40a, 40b, 42a and 42b is that the first harmonic co-vibration is phase-shifted by 180° in relation to the second harmonic co-vibration.

For this purpose, the first pair of seismic masses 40a and 40b is (indirectly) connected to first rotor mass 12a, while the second pair of seismic masses 42a and 42b moreover is (indirectly) connected to second rotor mass 12b. In the embodiment of FIG. 1, first seismic mass 40a of the first pair is also (directly) connected to a side of first drive structure 22a of the first pair facing away from first rotor mass 12a; second seismic mass 40b of the first pair is (directly) connected to a side of second drive structure 22b of the first pair facing away from first rotor mass 12a; first seismic mass 42a of the second pair is (directly) connected to a side of first drive structure 24a of the second pair facing away from second rotor mass 12b; and second seismic mass 42b of the second pair is (directly) connected to a side of second drive structure 24b of the second pair facing away from second rotor mass 12b.

This could be described as an "external connection" of drive structures 22a, 22b, 24a and 24b to the two rotor masses 12a and 12b and as an "external connection" of each seismic mass 40a, 40b, 42a and 42b to one of drive structures 22a, 22b, 24a and 24b in each case.

In addition, the four seismic masses 40a, 40b, 42a and 42b set into their respective harmonic co-vibration are deflectable/adjustable perpendicular to first plane of symmetry 14. In a third rotary motion of the micromechanical component about a third axis (not sketched) which is aligned perpendicular to substrate surface 10, the Coriolis force therefore deflects the four seismic masses 40a, 40b, 42a and 42b, set into their respective harmonic co-vibration, perpendicular to first plane of symmetry 14, the phase angle of 180° between the first harmonic co-vibration and the second harmonic co-vibration inducing a first adjustment motion 44a of first seismic mass 40a of the first pair and of second seismic mass 42b of the second pair, and a second adjustment motion 44b of second seismic mass 40b of the first pair and first seismic mass 42a of the second pair that is directed counter to first adjustment motion 44a. Adjustment motions 44a and 44b of the four seismic masses 40a, 40b, 42a, and 42b triggered by the Coriolis force are therefore in mirror symmetry with respect to first plane of symmetry 14. External linear and rotary accelerations of the micromechanical component do not trigger such adjustment motions 44a and 44b of the four seismic masses 40a, 40b, 42a and 42b with regard to first plane of symmetry 14. For that reason, the third rotary motion of the micromechanical component about the third axis is also reliably detectable with the aid of the four seismic masses 40a, 40b, 42a, and 42b.

For that reason, seismic masses 40a, 40b, 42a, and 42b are preferably developed with detection-electrode elements (not sketched), which form a capacitor with a (not depicted) stationary detection electrode in each case, which is fixed in place on substrate surface 10, for example. In a differential evaluation of the signals ascertained with the aid of their detection-electrode elements and the allocated stationary detection electrodes, the mirror symmetry of adjustment motions 44a and 44b of the four seismic masses 40a, 40b, 42a and 42b with regard to first plane of symmetry 14 causes an amplification of the signals attributable to the third rotary motion of the micromechanical component about the third axis, while error signals of the detection-electrode components and the stationary detection electrodes attributable to external linear and rotary accelerations of the micromechanical component are automatically corrected/"filtered out" by the differential evaluation.

In the embodiment of FIG. 1, the four seismic masses 40a, 40b, 42a and 42b are frame structures simply by way of example. The two first seismic masses 40a and 42a may optionally be connected to a first coupling rocker 48a via an individual spring element 46, and the two second seismic masses 40b and 42b may be connected to a second coupling rocker 48b via a spring element 46 in each case. In this case, each one of the two coupling rockers 48a and 48b is preferably pivotable about a rocker axis which centrally intersects respective coupling rocker 48a or 48b and is aligned perpendicular to substrate surface 10. In that case, coupling rockers 48a and 48b do not counteract adjustment motions 44a and 44b of the four seismic masses 40a, 40b, 42a and 42b, which are in mirror symmetry with respect to first plane of symmetry 14, while movements of first plane of symmetry 14 that are asymmetrical with respect to first plane of symmetry 14 are suppressed by the two coupling rockers 48a or 48b.

Figure 2:
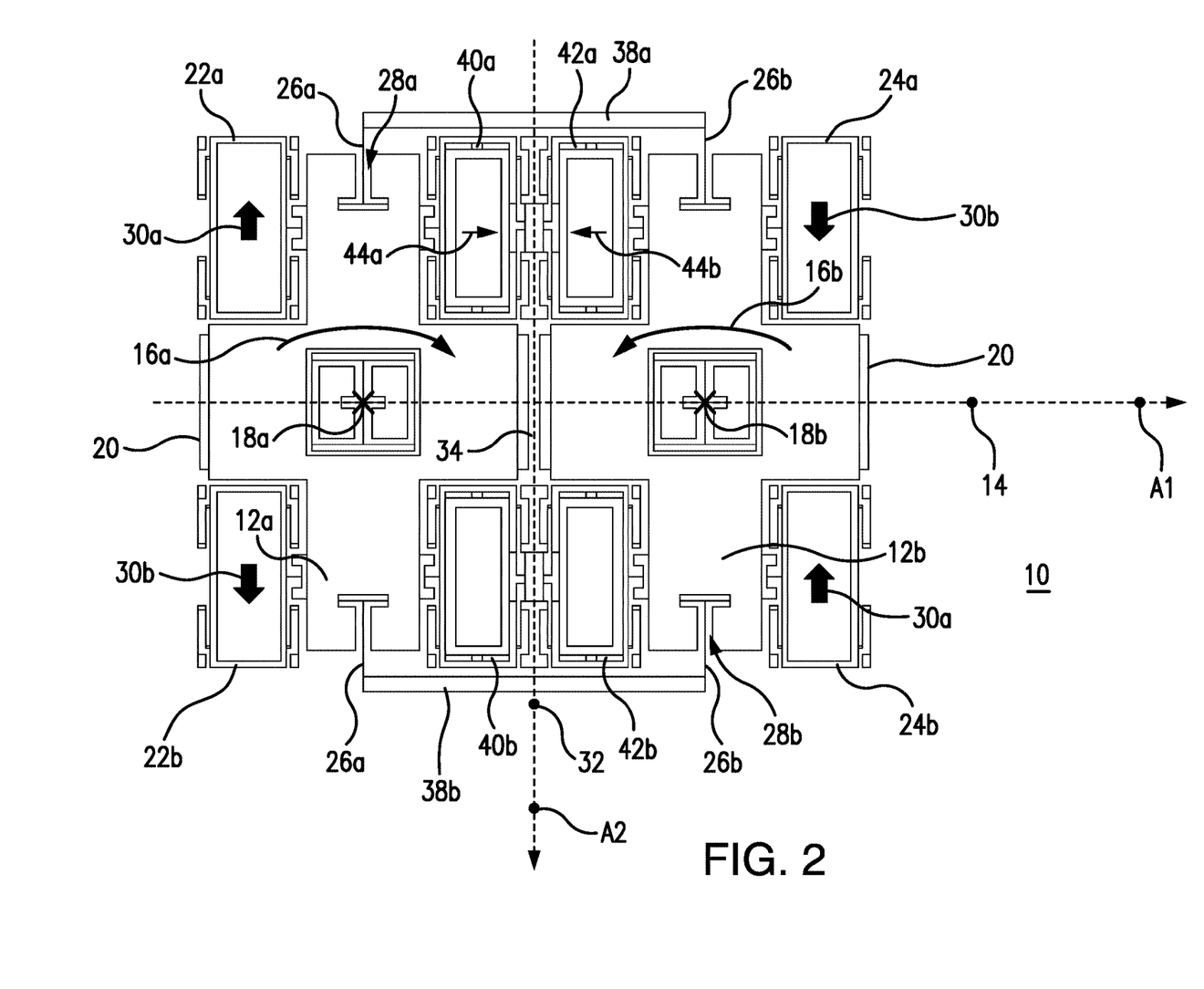
FIG. 2 shows a schematic partial representation of a second embodiment of the micromechanical component, in accordance with the present invention.

FIG. 2 shows a schematic partial illustration of a second embodiment of the micromechanical component.

In contrast to the previously described embodiment, the micromechanical component of FIG. 2 has as its at least one first component rocker structures 38a and 38b, which are aligned in parallel with the first plane of symmetry in each case and to which first rotor mass 12a is connected via the at least one first spring element 26a and second rotor mass 12b is connected via the at least one second spring element 26b. As a result, the advantages of the mechanical advantage realized by means of the "elongated spring structure" may also be utilized for connecting the two rotor masses 12a and 12b to the two rocker structures 38a and 38b.

In the micromechanical component schematically illustrated in FIG. 2, the two rotor masses 12a and 12b are developed in the shape of a cross or in the form of a plus sign in each case. This may be understood in such a way that each of the two rotor masses 12a and 12b has four arms, which project from its center in the outward direction. Inserted into the interspaces between two adjacent arms of respective rotor mass 12a or 12b is either a drive structure 22a, 22b, 24a or 24b allocated to respective rotor mass 12a or 12b, or a seismic mass 40a, 40b, 42a or 42b allocated to respective rotor mass 12a or 12b. Drive structures 22a, 22b, 24a and 24b and seismic masses 40a, 40b, 42a and 42b are coupled with allocated rotor mass 12a or 12b via springs. In addition, drive structures 22a, 22b, 24a and 24b and seismic masses 40a, 40b, 42a and 42b may be connected via at least one connection spring to/in the micromechanical component, in particular to substrate surface 10.

With regard to further features of the micromechanical component of FIG. 2 and its advantages, reference is made to the embodiment of FIG. 1.

In the afore-described micromechanical components, rotor masses 12a and 12b, drive structures 22a, 22b, 24a and 24b, seismic masses 40a, 40b, 42a and 42b, rocker structures 38a and 38b, coupling rockers 48a and 48b, and all springs are able to be patterned out of a semiconductor layer that is deposited on substrate surface 10, such as in particular a silicon layer.

In the afore-described embodiments, each spring element 26a and 26b has a first web-shaped section, which projects from its adjacent lateral concavity 28a or 28b, and a second web-shaped section, which is aligned perpendicular to the first web-shaped section and on which the first web-shaped section is anchored, the two ends of the second web-shaped section being connected to allocated rotor mass 12a or 12b. However, this embodiment of spring elements 26a and 26b is merely of an exemplary nature.

All afore-described micromechanical components are suitable for use as (at least part of a) yaw rate sensor such as in particular a 3-axis yaw rate sensor, by which the first rotary motion about first axis A1, the second rotary motion about second axis A2 as well as the third rotary motion about the third axis aligned perpendicular to substrate surface 10 are detectable. A detection of the respective rotary motion may be understood both as a detection of the respective rotary motion and a measurement of a physical variable representing the respective rotary motion such as a rate of rotation, a rotational speed and/or an angular speed.

Figure 3:
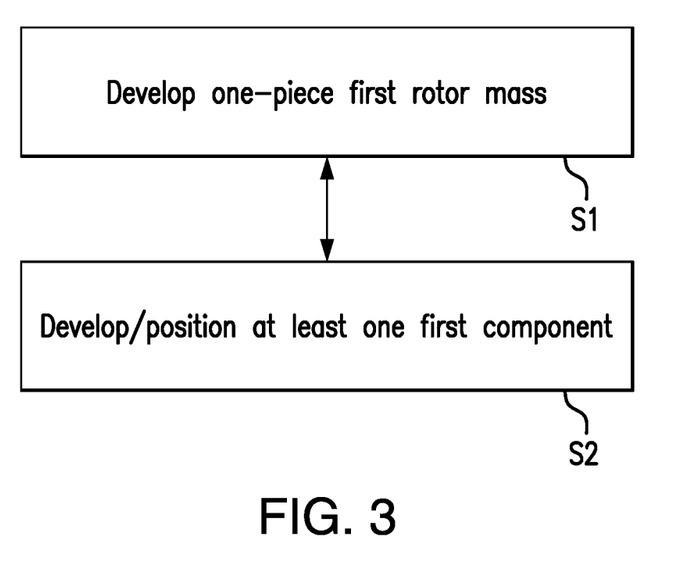
FIG. 3 shows a flow diagram to describe an embodiment of the production method for a micromechanical component for a yaw rate sensor, in accordance with the present invention.

FIG. 3 shows a flow diagram to describe an embodiment of the production method for a micromechanical component for a yaw rate sensor.

In a method step S1, a one-piece first rotor mass of the micromechanical component is developed/positioned in such a way that the first rotor mass is able to be set into a first torsional vibration about a first axis of rotation aligned perpendicular to a substrate surface of a substrate of the micromechanical component. As a method step S2, at least one first component of the micromechanical component is also developed/positioned, the first rotor mass being connected via at least one first spring element to the at least one first component. In addition, the at least one first spring element, which extends through a lateral concavity on the first rotor mass in each case, is connected to a recessed edge region of the first rotor mass. Examples of the at least one first component have already been described earlier in the text. In this way, an execution of the described production method also brings about the aforementioned advantages.

Method steps S1 and S2 are able to be carried out in any time sequence, simultaneously or overlapping in time.

What is claimed is:

1. A micromechanical component for a yaw rate sensor, comprising:
    a substrate having a substrate surface;
    a first rotor mass developed in one piece, which is able to be set into a first torsional vibration about a first axis of rotation aligned perpendicular to the substrate surface; and
    at least one first component of the micromechanical component, the first rotor mass being connected to the at least one first component via at least one first spring element, wherein the at least one first spring element extends through a lateral concavity on the first rotor mass and is connected to a recessed edge region of the first rotor mass,
    wherein the lateral concavity is an indentation or a depression on a side of the first rotor mass,
    a second rotor mass developed in one piece, which is realized in mirror symmetry with the first rotor mass in relation to a plane of symmetry that is aligned perpendicular to the substrate surface and centrally intersects the first rotor mass and the second rotor mass, the second rotor mass being able to be set into a second torsional vibration, phase-shifted in phase by 180° in relation to the first torsional vibration, about a second axis of rotation aligned in parallel with the first axis of rotation, the second rotor mass being connected via at least one second spring element to the at least one first component and/or to at least one second component of the micromechanical component, each of the at least one second spring element extending through a lateral concavity on the second rotor mass and being connected to a recessed edge region of the second rotor mass,
    wherein the micromechanical component, as the at least one first component, has a first pair of drive structures, and, as the at least one second component, has a second pair of drive structures, first drive structures of the first pair of drive structures and the second pair of drive structures, situated on a first side of the plane of symmetry, are in mirror symmetry with second drive structures of the first pair of drive structures and the second pair of drive structures situated on a second side of the plane of symmetry, in relation to the plane of symmetry, and the first drive structure of the first pair of drive structures is able to be set into a first harmonic torsional vibration aligned in parallel with the plane of symmetry; the second drive structure of the first pair of drive structures is able to be set into a second harmonic torsional vibration, which is aligned in parallel with the plane of symmetry and phase-shifted by 180° in relation to the first harmonic torsional vibration; the first drive structure of the second pair of drive structures is able to be set into the second harmonic torsional vibration, and the second drive structure of the second pair of drive structures is able to be set into the first harmonic torsional vibration such that the first and second rotor masses are set into their respective torsional vibration with the aid of the first and second pairs of drive structures set into their respective torsional vibration,
    wherein the micromechanical component additionally has a first pair of seismic masses and a second pair of seismic masses, a first seismic mass each of the first pair and the second pair, situated on a first side of the plane of symmetry, is in mirror symmetry in relation to the plane of symmetry with second seismic masses of the first pair and the second pair situated on a second side of the plane of symmetry, and the first and second pair of seismic masses are able to be set into harmonic torsional co-vibrations which are aligned in parallel with the plane of symmetry, with the aid of the first and second rotor masses set into their respective torsional vibration and/or with the aid of the first and second pair of drive structures set into their respective harmonic torsional vibration,
    the first pair of seismic masses is connected to a first coupling rocker, and the second pair of seismic masses is connected to a second coupling rocker, wherein each of the two coupling rockers is pivotable about a rocker axis which is aligned perpendicular to the substrate surface.

2. The micromechanical component as recited in claim 1, wherein the first and second rotor masses are developed and/or positioned in such a way that the first and second rotor masses, set into their respective torsional vibration, are pivotable about an axis of rotation situated in the plane of symmetry and pivotable about a further axis of rotation aligned perpendicular to the plane of symmetry in each case.

3. The micromechanical component as recited in claim 2, wherein the micromechanical component, as the at least one first component, includes at least one rocker structure which is aligned in parallel with the plane of symmetry and to which the first rotor mass is connected via the at least one first spring element and the second rotor mass is connected via the at least one second spring element.

4. The micromechanical component as recited in claim 1, wherein the first and second rotor masses are developed and/or situated in such a way that when the first and second rotor masses are set into their respective torsional vibration, a vector sum of a first torque of the first torsional vibration of the first rotor mass and of a second torque of the second torsional vibration of the second rotor mass is equal to zero.

5. The micromechanical component as recited in claim 1, wherein the first and second pair of seismic masses, set into their respective harmonic torsional co-vibrations, are also deflectable perpendicular to the plane of symmetry.

6. A yaw rate sensor, comprising:
a micromechanical component, including:
a substrate having a substrate surface,
a first rotor mass developed in one piece, which is able to be set into a first torsional vibration about a first axis of rotation aligned perpendicular to the substrate surface, and
at least one first component of the micromechanical component, the first rotor mass being connected to the at least one first component via at least one first spring element, wherein the at least one first spring element extends through a lateral concavity on the first rotor mass and is connected to a recessed edge region of the first rotor mass,
wherein the lateral concavity is an indentation or a depression on a side of the first rotor mass,
a second rotor mass developed in one piece, which is realized in mirror symmetry with the first rotor mass in relation to a plane of symmetry that is aligned perpendicular to the substrate surface and centrally intersects the first rotor mass and the second rotor mass, the second rotor mass being able to be set into a second torsional vibration, phase-shifted in phase by 180° in relation to the first torsional vibration, about a second axis of rotation aligned in parallel with the first axis of rotation, the second rotor mass being connected via at least one second spring element to the at least one first component and/or to at least one second component of the micromechanical component, each of the at least one second spring element extending through a lateral concavity on the second rotor mass and being connected to a recessed edge region of the second rotor mass,
wherein the micromechanical component, as the at least one first component, has a first pair of drive structures, and, as the at least one second component, has a second pair of drive structures, first drive structures of the first pair of drive structures and the second pair of drive structures, situated on a first side of the plane of symmetry, are in mirror symmetry with second drive structures of the first pair of drive structures and the second pair of drive structures situated on a second side of the plane of symmetry, in relation to the plane of symmetry, and the first drive structure of the first pair of drive structures is able to be set into a first harmonic torsional vibration aligned in parallel with the plane of symmetry; the second drive structure of the first pair of drive structures is able to be set into a second harmonic torsional vibration, which is aligned in parallel with the plane of symmetry and phase-shifted by 180° in relation to the first harmonic torsional vibration; the first drive structure of the second pair of drive structures is able to be set into the second harmonic torsional vibration, and the second drive structure of the second pair of drive structures is able to be set into the first harmonic torsional vibration such that the first and second rotor masses are set into their respective torsional vibration with the aid of the first and second pairs of drive structures set into their respective torsional vibration,
wherein the micromechanical component additionally has a first pair of seismic masses and a second pair of seismic masses, a first seismic mass each of the first pair and the second pair, situated on a first side of the plane of symmetry, is in mirror symmetry in relation to the plane of symmetry with second seismic masses of the first pair and the second pair situated on a second side of the plane of symmetry, and the first and second pair of seismic masses are able to be set into harmonic torsional co-vibrations which are aligned in parallel with the plane of symmetry, with the aid of the first and second rotor masses set into their respective torsional vibration and/or with the aid of the first and second pair of drive structures set into their respective harmonic torsional vibration,
the first pair of seismic masses is connected to a first coupling rocker, and the second pair of seismic masses is connected to a second coupling rocker, wherein each of the two coupling rockers is pivotable about a rocker axis which is aligned perpendicular to the substrate surface.

7. A production method for a micromechanical component for a yaw rate sensor, the method comprising the following steps:
developing and/or positioning a first rotor mass, developed in one piece, of the micromechanical component such that the first rotor mass is able to be set into a first torsional vibration about a first axis of rotation aligned perpendicular to a substrate surface of a substrate of the micromechanical component; and
developing and/or positioning at least one first component of the micromechanical component, the first rotor mass being connected via at least one first spring element to the at least one first component, wherein the at least one first spring element, which extends through a lateral concavity on the first rotor mass, is connected to a recessed edge region of the first rotor mass,
wherein the lateral concavity is an indentation or a depression on a side of the first rotor mass,
a second rotor mass developed in one piece, which is realized in mirror symmetry with the first rotor mass in relation to a plane of symmetry that is aligned perpendicular to the substrate surface and centrally intersects the first rotor mass and the second rotor mass, the second rotor mass being able to be set into a second torsional vibration, phase-shifted in phase by 180° in relation to the first torsional vibration, about a second axis of rotation aligned in parallel with the first axis of rotation, the second rotor mass being connected via at least one second spring element to the at least one first component and/or to at least one second component of the micromechanical component, each of the at least one second spring element extending through a lateral concavity on the second rotor mass and being connected to a recessed edge region of the second rotor mass,
wherein the micromechanical component, as the at least one first component, has a first pair of drive structures, and, as the at least one second component, has a second pair of drive structures, first drive structures of the first pair of drive structures and the second pair of drive structures, situated on a first side of the plane of symmetry, are in mirror symmetry with second drive structures of the first pair of drive structures and the second pair of drive structures situated on a second side of the plane of symmetry, in relation to the plane of symmetry, and the first drive structure of the first pair of drive structures is able to be set into a first harmonic torsional vibration aligned in parallel with the plane of symmetry; the second drive structure of the first pair of drive structures is able to be set into a second harmonic torsional vibration, which is aligned in parallel with the plane of symmetry and phase-shifted by 180° in relation to the first harmonic torsional vibration; the first drive structure of the second pair of drive structures is able to be set into the second harmonic torsional vibration, and the second drive structure of the second pair of drive structures is able to be set into the first harmonic torsional vibration such that the first and second rotor masses are set into their respective torsional vibration with the aid of the first and second pairs of drive structures set into their respective torsional vibration, wherein the micromechanical component additionally has a first pair of seismic masses and a second pair of seismic masses, a first seismic mass each of the first pair and the second pair, situated on a first side of the plane of symmetry, is in mirror symmetry in relation to the plane of symmetry with second seismic masses of the first pair and the second pair situated on a second side of the plane of symmetry, and the first and second pair of seismic masses are able to be set into harmonic torsional co-vibrations which are aligned in parallel with the plane of symmetry, with the aid of the first and second rotor masses set into their respective torsional vibration and/or with the aid of the first and second pair of drive structures set into their respective harmonic torsional vibration, the first pair of seismic masses is connected to a first coupling rocker, and the second pair of seismic masses is connected to a second coupling rocker, wherein each of the two coupling rockers is pivotable about a rocker axis which is aligned perpendicular to the substrate surface.

* * * * *